(12) United States Patent
Chen et al.

(10) Patent No.: US 7,692,907 B2
(45) Date of Patent: Apr. 6, 2010

(54) CIRCUIT FOR ELECTROSTATIC DISCHARGE (ESD) PROTECTION

(75) Inventors: Shih-Hung Chen, Taipei County (TW); Ming-Dou Ker, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 357 days.

(21) Appl. No.: 11/717,948

(22) Filed: Mar. 13, 2007

(65) Prior Publication Data

US 2008/0062597 A1    Mar. 13, 2008

Related U.S. Application Data

(60) Provisional application No. 60/825,152, filed on Sep. 11, 2006.

(51) Int. Cl.
H02H 9/00 (2006.01)
H02H 3/20 (2006.01)
H02H 9/04 (2006.01)
H02H 3/22 (2006.01)
H01C 7/12 (2006.01)
H02H 1/00 (2006.01)
H02H 1/04 (2006.01)

(52) U.S. Cl. .................. 361/56; 361/91.1; 361/111; 361/118

(58) Field of Classification Search .......... 361/56
See application file for complete search history.

(56) References Cited

U.S. PATENT DOCUMENTS

| 6,011,681 A * | 1/2000 | Ker et al. ............ 361/111 |
| 6,075,686 A * | 6/2000 | Ker .................... 361/56 |
| 6,404,269 B1 * | 6/2002 | Voldman ............. 327/534 |
| 6,444,542 B2 | 9/2002 | Moise |
| 6,462,601 B1 * | 10/2002 | Chang et al. ......... 327/313 |
| 6,963,110 B2 | 11/2005 | Woo |
| 7,110,228 B2 * | 9/2006 | Chang ................ 361/56 |
| 7,233,467 B2 * | 6/2007 | Mergens et al. ....... 361/56 |
| 7,245,467 B2 * | 7/2007 | Yeh et al. ............ 361/56 |
| 7,352,547 B2 * | 4/2008 | Okushima ........... 361/56 |
| 2004/0169541 A1 * | 9/2004 | Hirata ................ 327/333 |
| 2005/0152081 A1 | 7/2005 | Worley |
| 2005/0270712 A1 | 12/2005 | Huang |
| 2006/0262472 A1 * | 11/2006 | Okushima .......... 361/91.1 |
| 2007/0018193 A1 | 1/2007 | Ker |

* cited by examiner

Primary Examiner—Albert W Paladini
Assistant Examiner—Dharti H Patel
(74) Attorney, Agent, or Firm—Alston & Bird LLP

(57) ABSTRACT

A circuit capable of providing electrostatic discharge (ESD) protection, the circuit comprising a first set of power rails comprising a first high power rail and a first low power rail, a first interface circuit between the first set of power rails, the first interface circuit having at least one gate electrode, a first ESD device comprising a terminal coupled to the at least one gate electrode of the first interface circuit, and a second ESD device comprising a terminal coupled to the at least one gate electrode of the first interface circuit, the first ESD device and the second ESD device being configured to maintain a voltage level at the at least one gate electrode of the first interface circuit at approximately a ground level when ESD occurs.

35 Claims, 14 Drawing Sheets

CIRCUIT FOR ELECTROSTATIC DISCHARGE (ESD) PROTECTION

CROSS-REFERENCE TO RELATED APPLICATIONS

This application claims the benefit of U.S. Provisional Application No. 60/825,152, filed Sep. 11, 2006.

BACKGROUND OF THE INVENTION

The present invention relates generally to electrostatic discharge (ESD) protection and, more particularly, to circuits for providing ESD protection in a multi-power domain.

A semiconductor integrated circuit (IC) is generally susceptible to electrostatic discharge (ESD), which may damage or destroy the IC. ESD generally refers to a phenomenon of electrical discharge of a current (positive or negative) for a short duration during which a relatively large amount of current passes through a part of the IC. The current surge may exceed what the IC can normally tolerate and may cause undesirable impact to the IC's operation or damage the IC or its components. To prevent ESD damages, many ICs have ESD protection circuit or circuits and may rely on different approaches of ESD protection for different applications.

In a large electronic system having multiple sub-systems, such as in a computer system, there are generally a number of power supplies providing different power levels. The sub-systems, such as ICs and chips in the system, often require separate power supplies with different voltages. And interface circuits may exist to provide communications of signals between two sub-systems. However, interface circuits between the sub-systems, if not properly protected, are susceptible to damages by ESD. FIG. 1 is an exemplary circuit diagram of a conventional multi-power system 10 with interface circuits. Referring to FIG. 1 as an example, the system 10 includes rail-to-rail ESD clamp circuits 11 and 12 for ESD protection. However, when ESD occurs, because power supplies in the system 10 remain floating, a p-type metal-oxide-semiconductor ("PMOS") transistor Mp is turned on and supplies an ESD current $I_{ESD}$ toward an n-type metal-oxide-semiconductor ("NMOS") transistor Mn of an interface device 15. The ESD current may damage or degrade the gate oxide of the NMOS transistor Mn. According to the example, ESD can easily occur in a system having multiple power supplies, and it may be desirable to provide ESD protection circuits to protect interface circuits from being damaged by ESD. Furthermore, it is necessary that the ESD clamp circuits meet the requirements of different power voltages.

BRIEF SUMMARY OF THE INVENTION

Examples of the present invention may provide a circuit capable of providing electrostatic discharge (ESD) protection, the circuit comprising a first set of power rails comprising a first high power rail and a first low power rail, a first interface circuit between the first set of power rails, the first interface circuit having at least one gate electrode, a first ESD device comprising a terminal coupled to the at least one gate electrode of the first interface circuit, and a second ESD device comprising a terminal coupled to the at least one gate electrode of the first interface circuit, the first ESD device and the second ESD device being configured to maintain a voltage level at the at least one gate electrode of the first interface circuit at approximately a ground level when ESD occurs.

Some examples of the present invention may provide a circuit capable of providing electrostatic discharge (ESD) protection that comprises a first set of power rails further comprising a first high power rail and a first low power rail, a second set of power rails further comprising a second high power rail and a second low power rail, a first interface circuit between the first set of power rails further comprising at least one gate electrode, a second interface circuit between the second set of power rails further comprising an output connected to the at least one gate electrode, and an ESD device further comprising a terminal connected to the at least one gate electrode of the first interface circuit, the ESD device being capable of pulling a voltage level at the at least one gate electrode to a relatively grounded level in response to an ESD stress occurring on the second high power rail as one of the first set of power rails being relatively grounded, or occurring on the first high power rail as one of the second set of power rails being relatively grounded.

Examples of the present invention may also provide a circuit capable of providing electrostatic discharge (ESD) protection that comprises a first set of power rails further comprising a first high power rail and a first low power rail, a second set of power rails further comprising a second high power rail and a second low power rail, a first interface circuit between the first set of power rails further comprising a gate electrode and a first terminal, a second interface circuit between the second set of power rails further comprising an output connected to the gate electrode, the second interface circuit being capable of pulling a voltage level at the gate electrode to that of the second low power rail in response an ESD stress, and an ESD device further comprising a terminal connected to the first terminal of the first interface circuit, the ESD device being capable of pulling a voltage level at the first terminal to that of the first low power rail or the second low power rail.

Examples of the present invention may further provide a circuit capable of providing electrostatic discharge (ESD) protection that comprises a first set of power rails further comprising a first high power rail and a first low power rail, a second set of power rails further comprising a second high power rail and a second low power rail, a first interface circuit between the first set of power rails further comprising a gate electrode, a second interface circuit between the second set of power rails further comprising an output connected to the gate electrode, and an ESD device further comprising a silicon-controlled rectifier (SCR) and a transistor capable of triggering the SCR in response to an ESD stress occurring on one of the first high power rail and the second high power rail.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It

Figure 1:
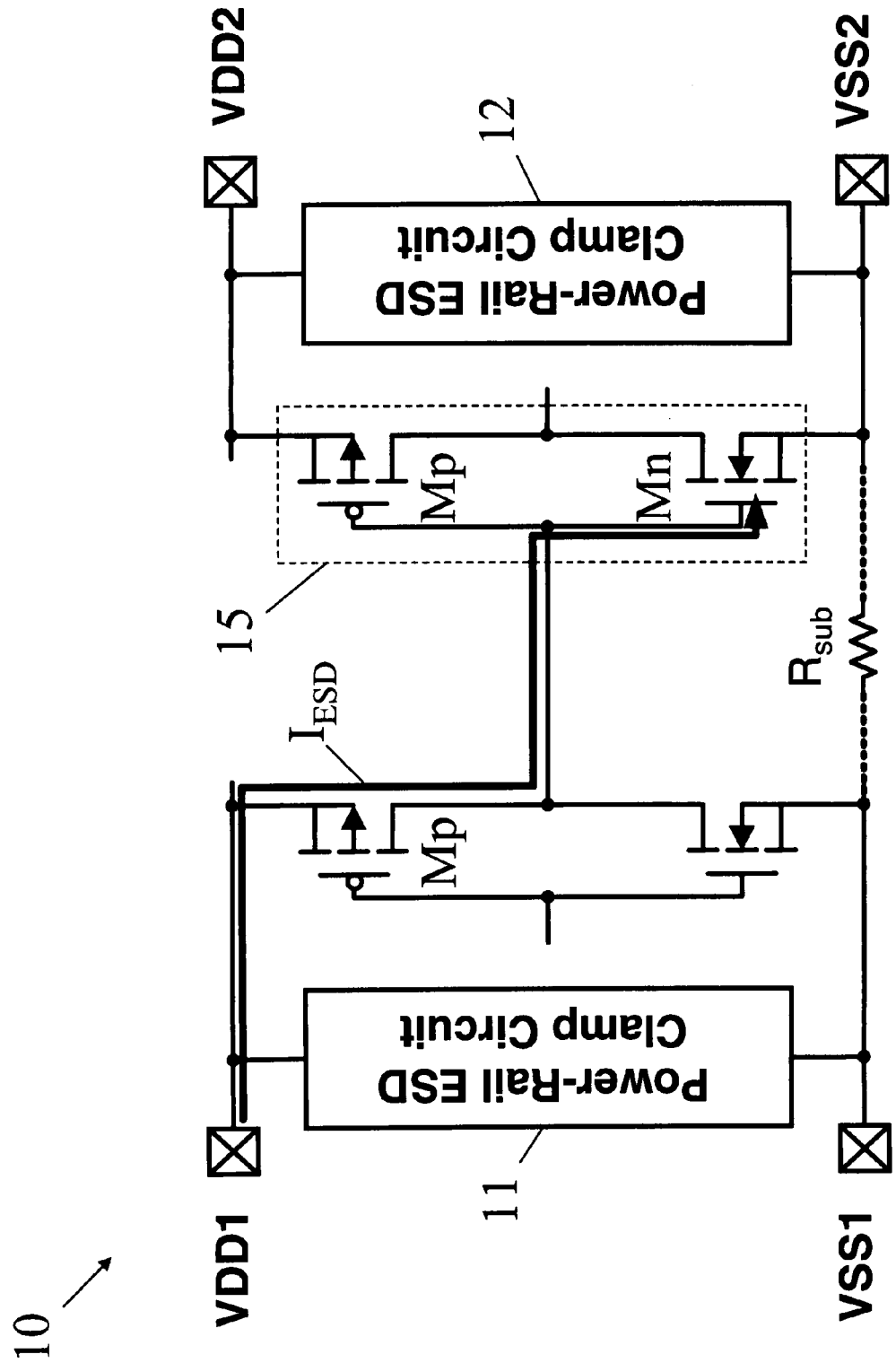

3 should be understood, however, that the invention is not limited to the precise arrangements and instrumentalities shown.

Figure 2A:
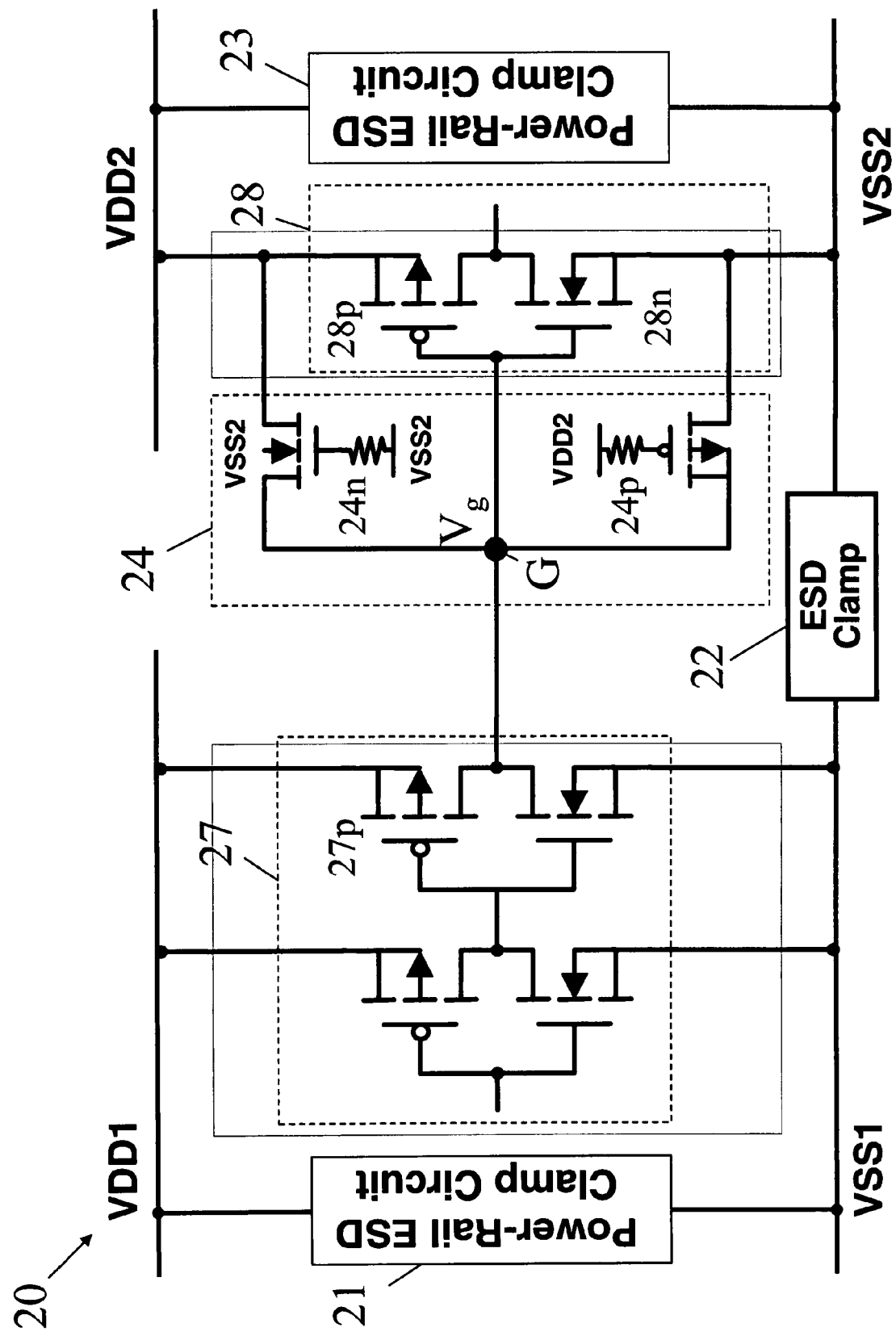
Figure 2B:
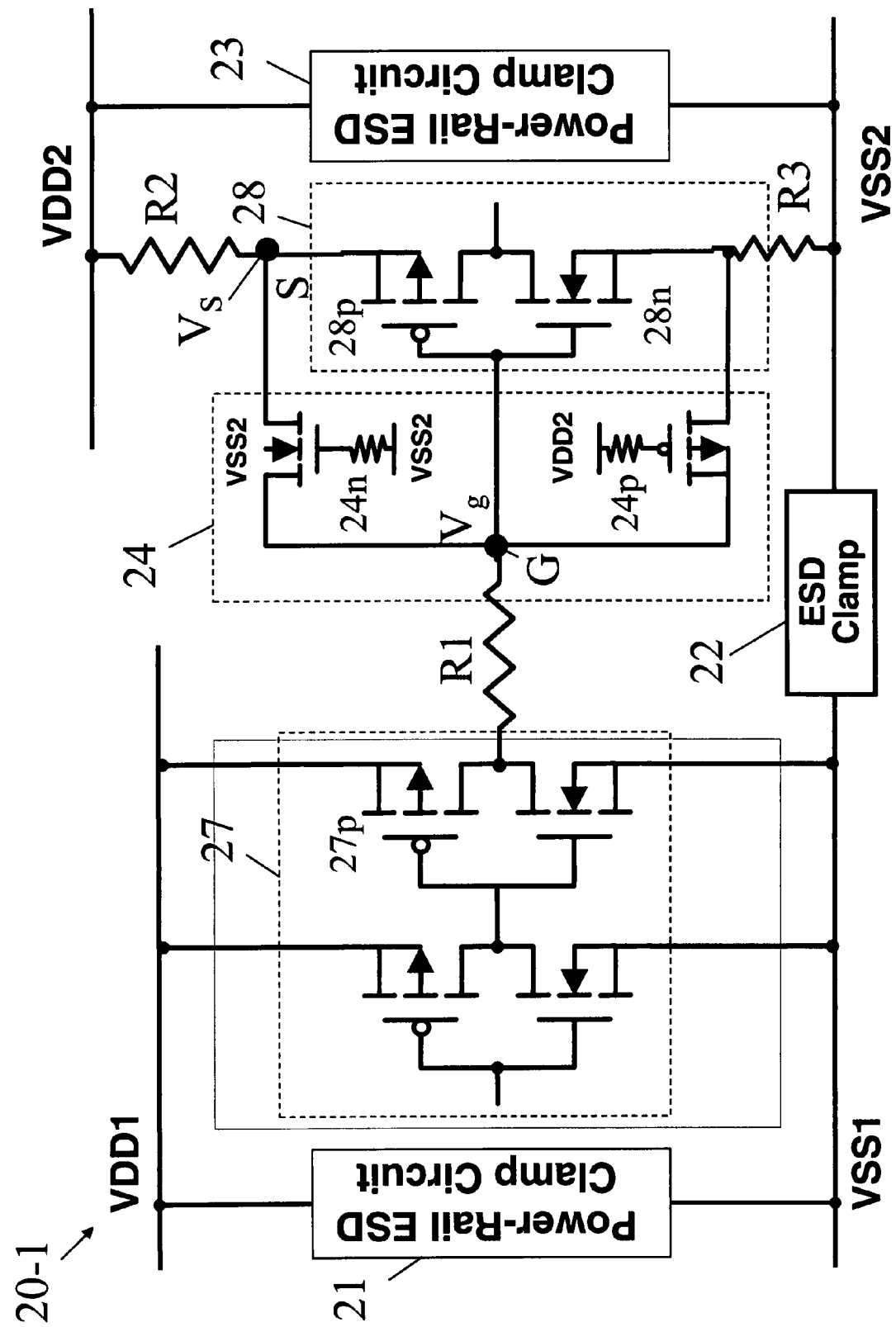
Figure 2C:
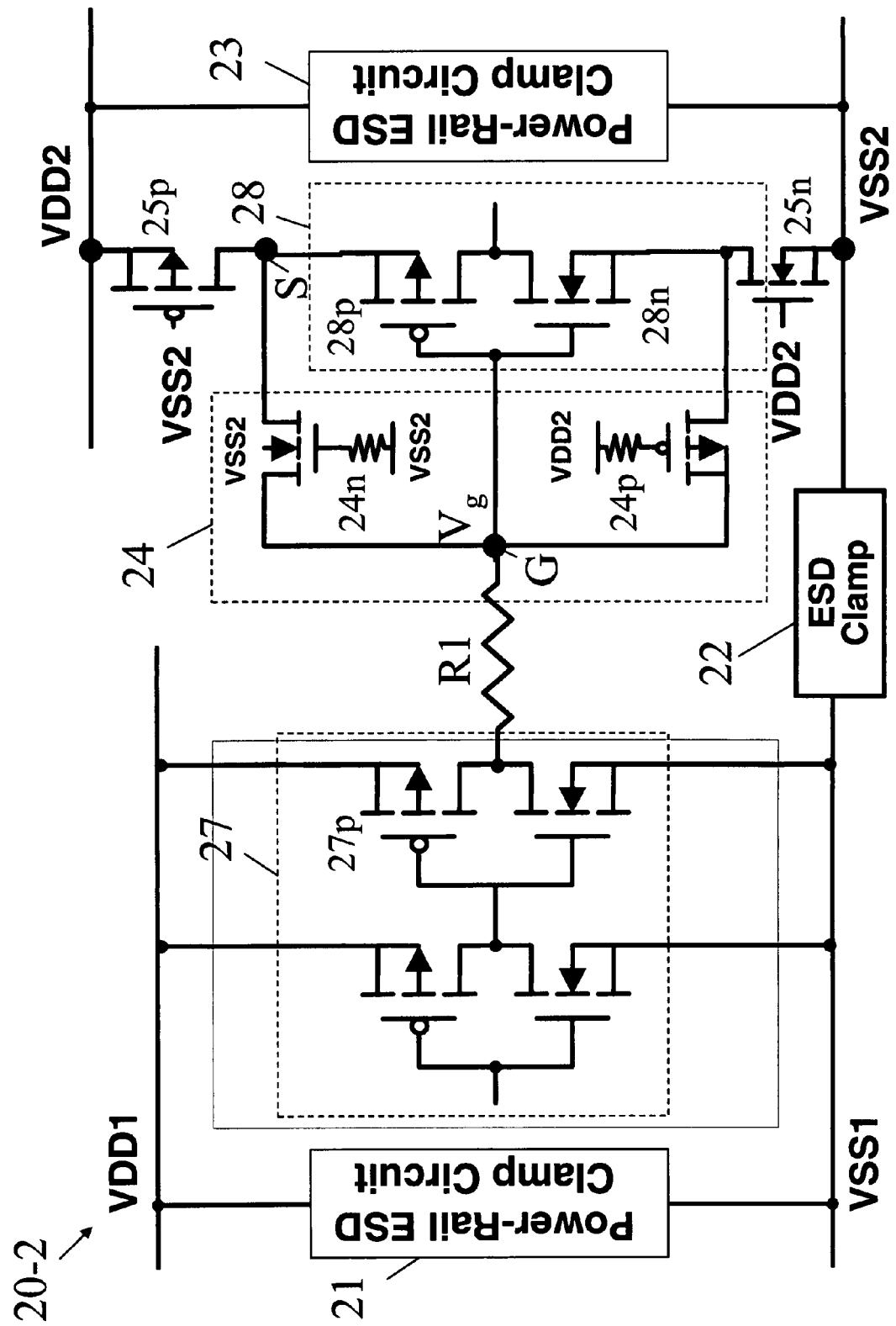
Figure 2D:
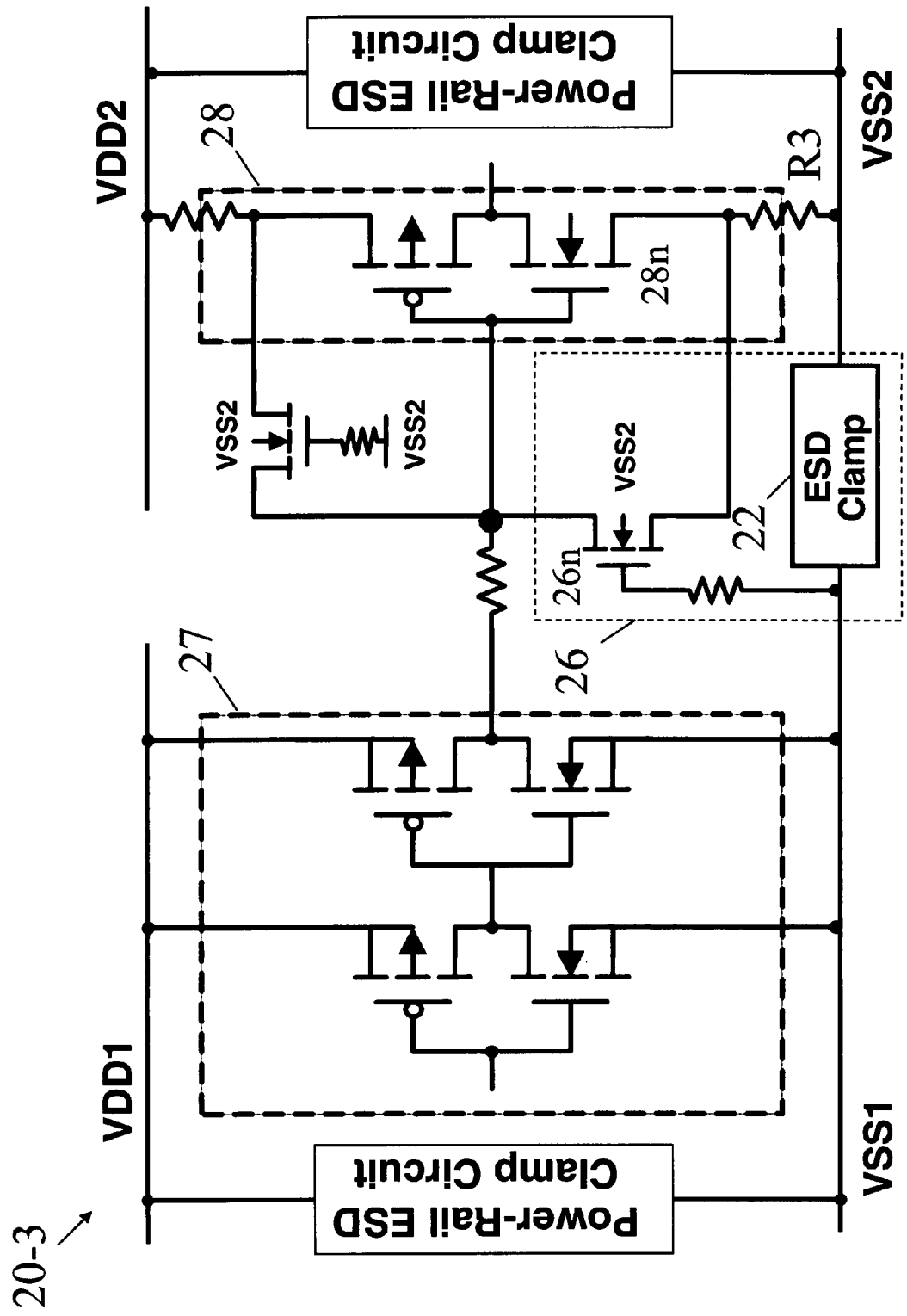
Figure 2E:
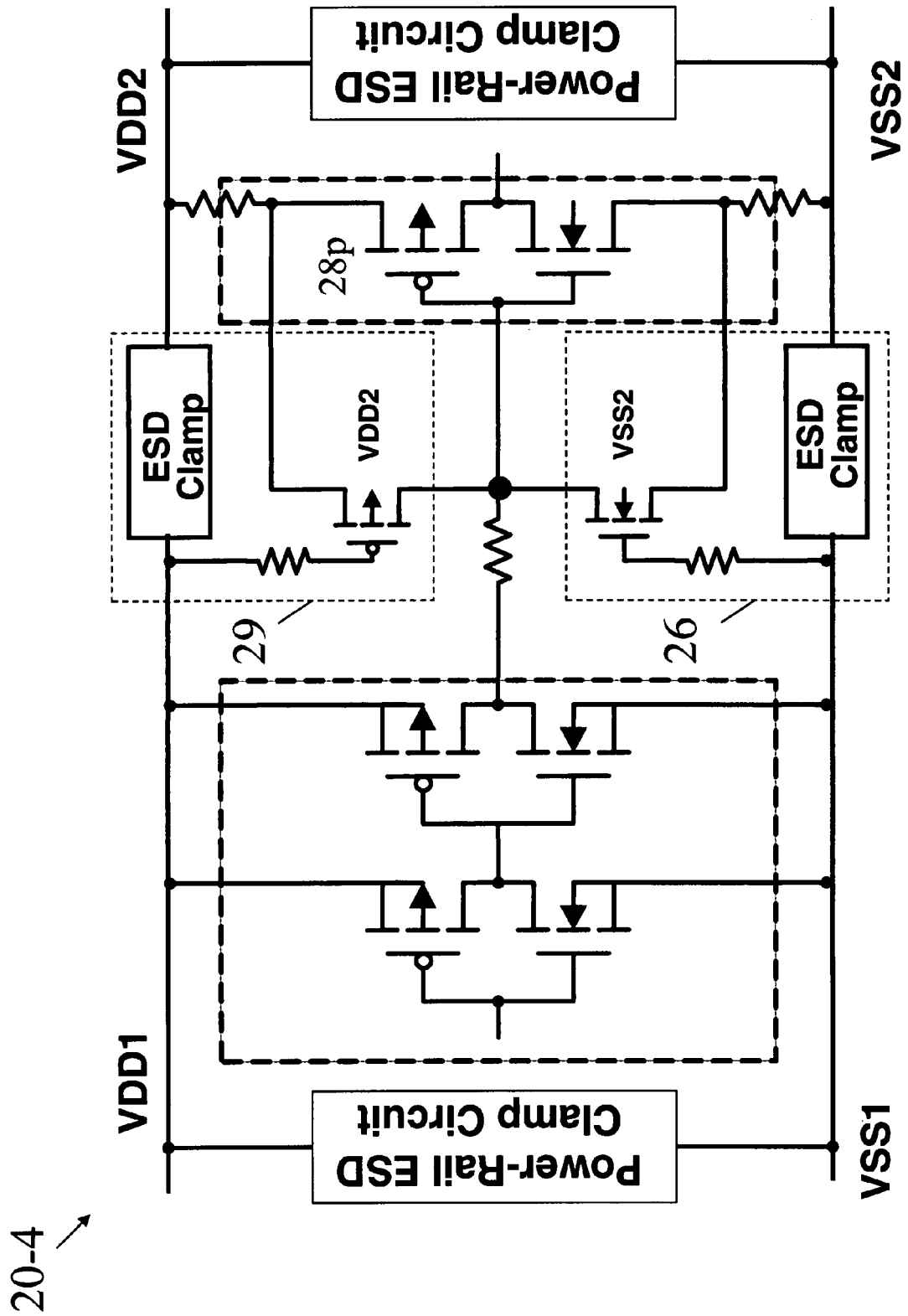
Figure 3A:
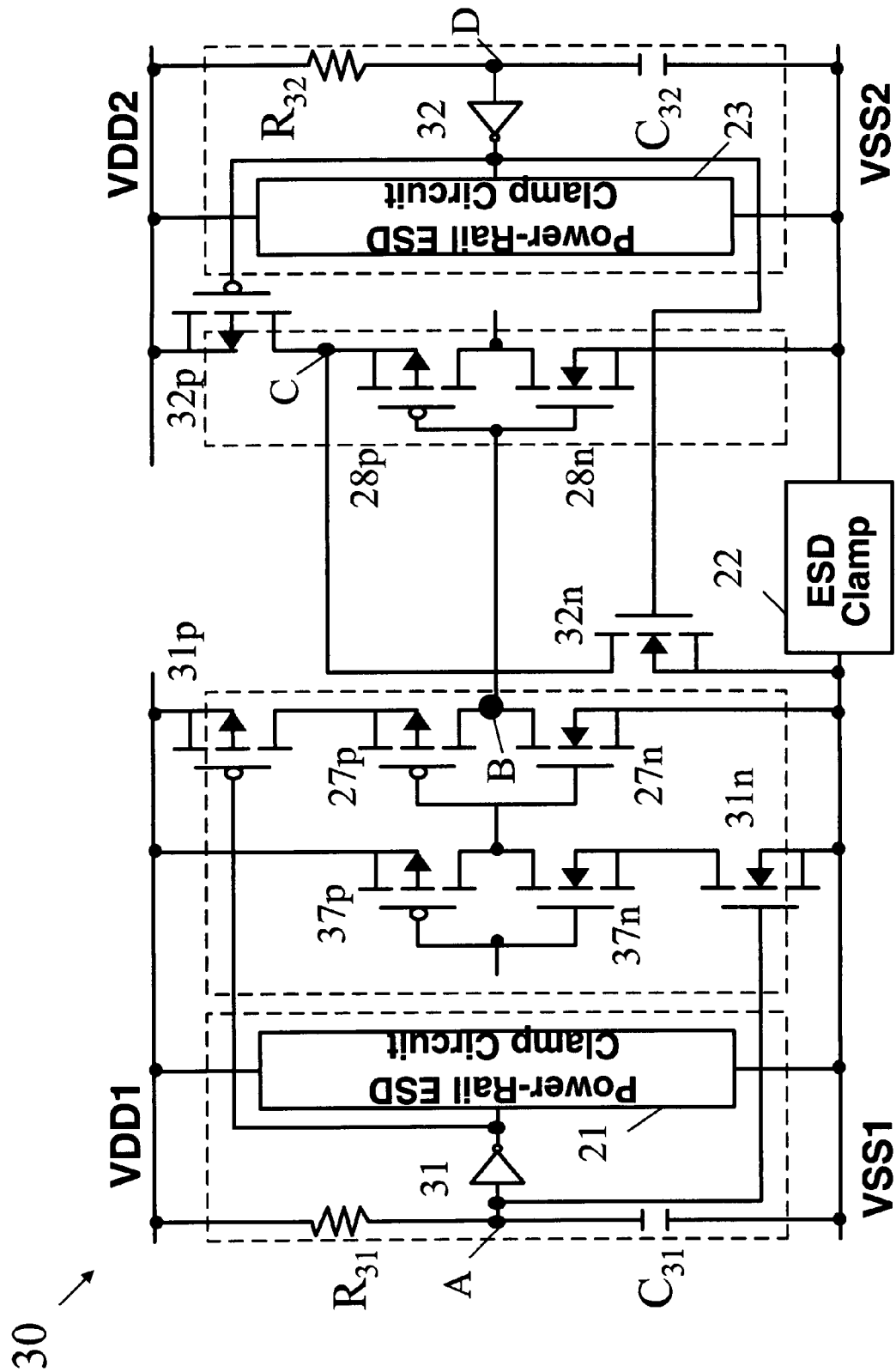
Figure 3B:
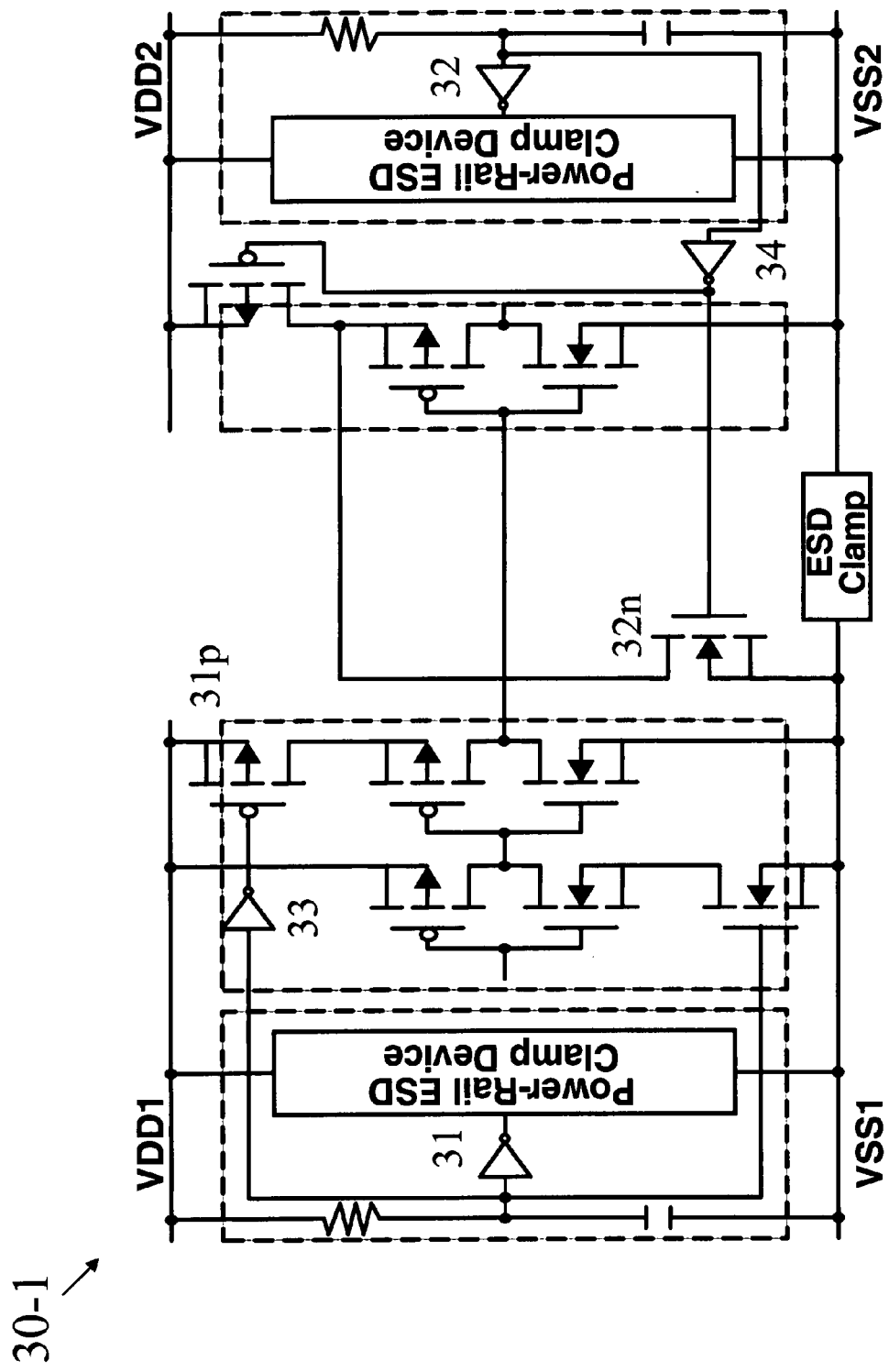
Figure 3C:
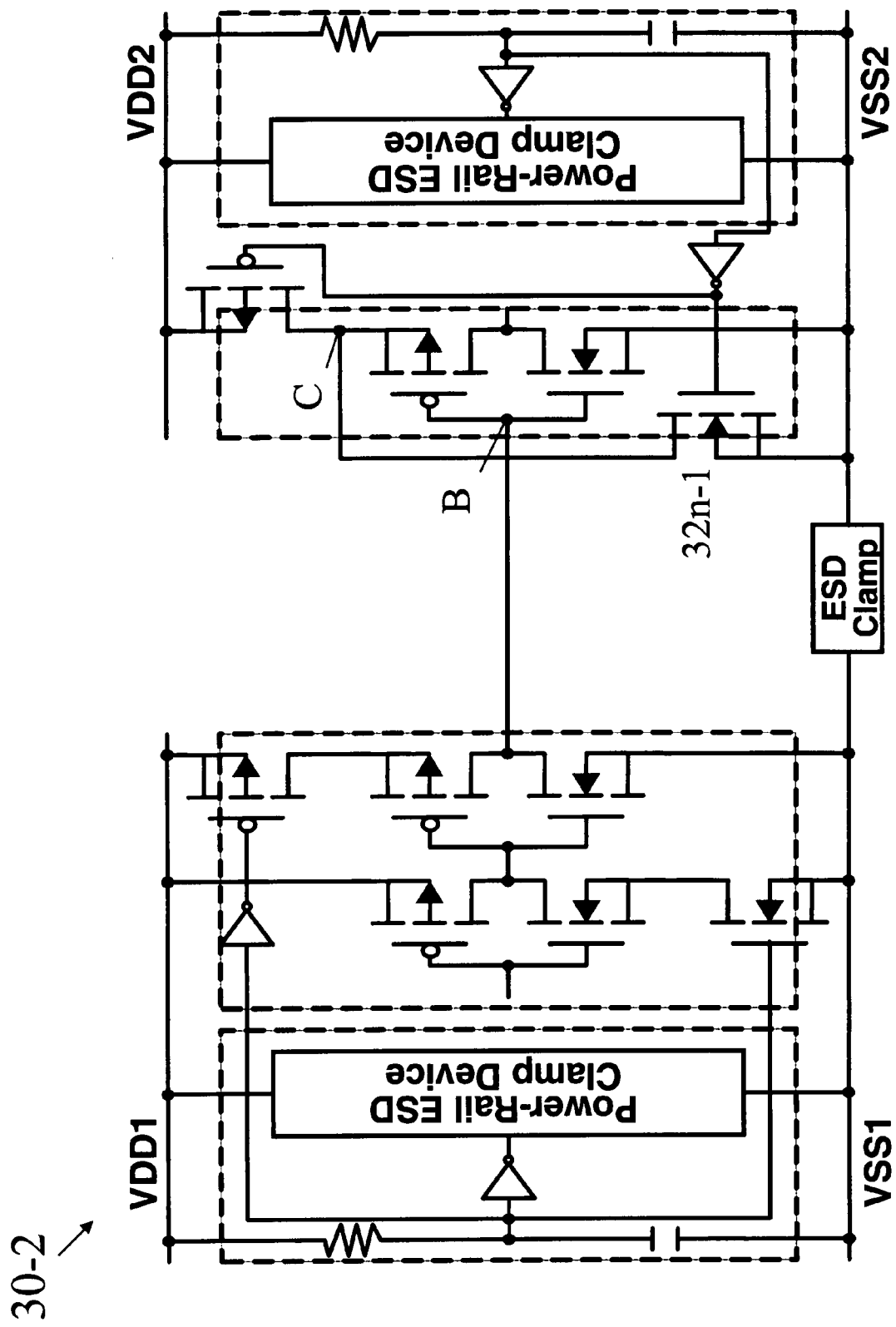
Figure 3D:
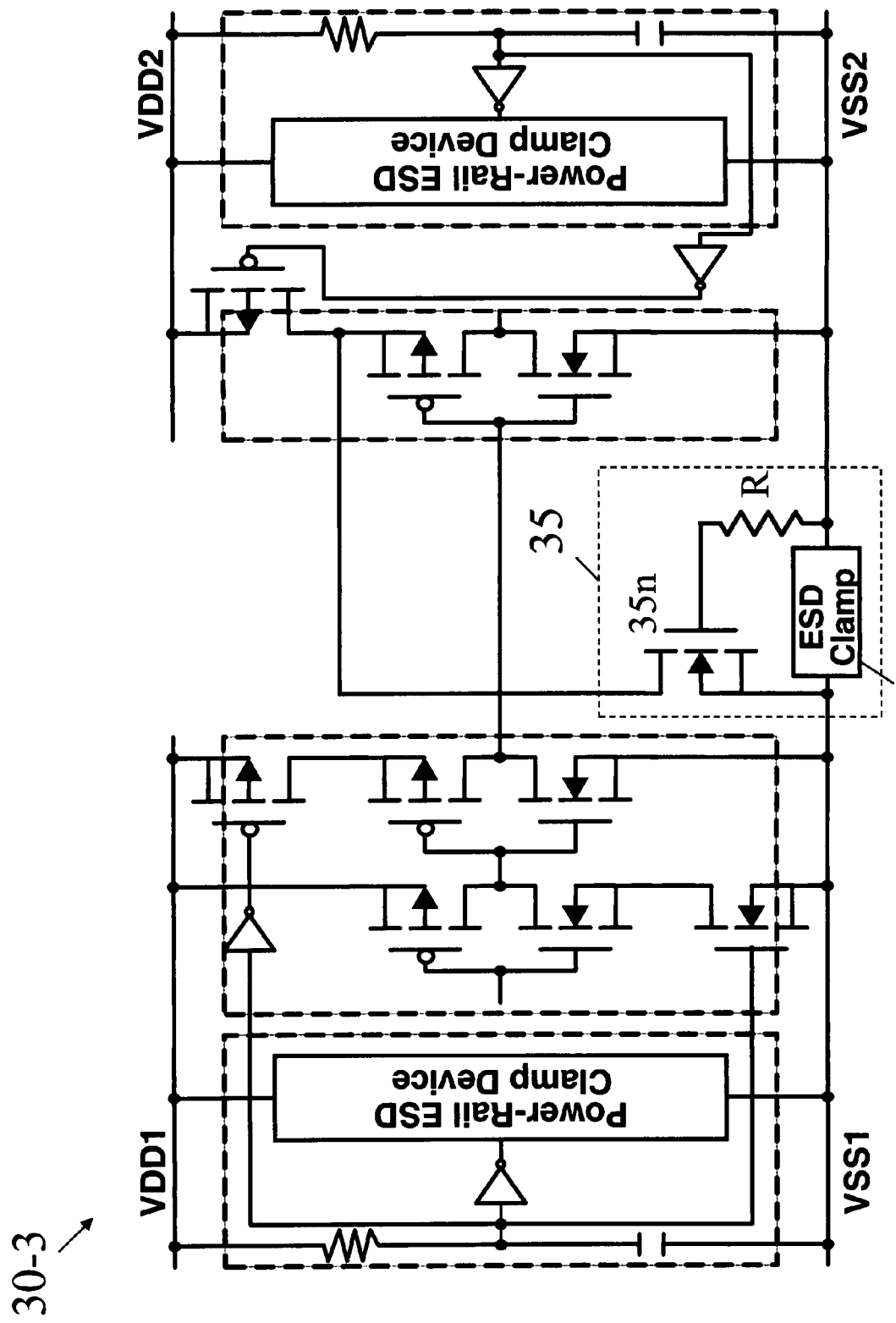
Figure 3E:
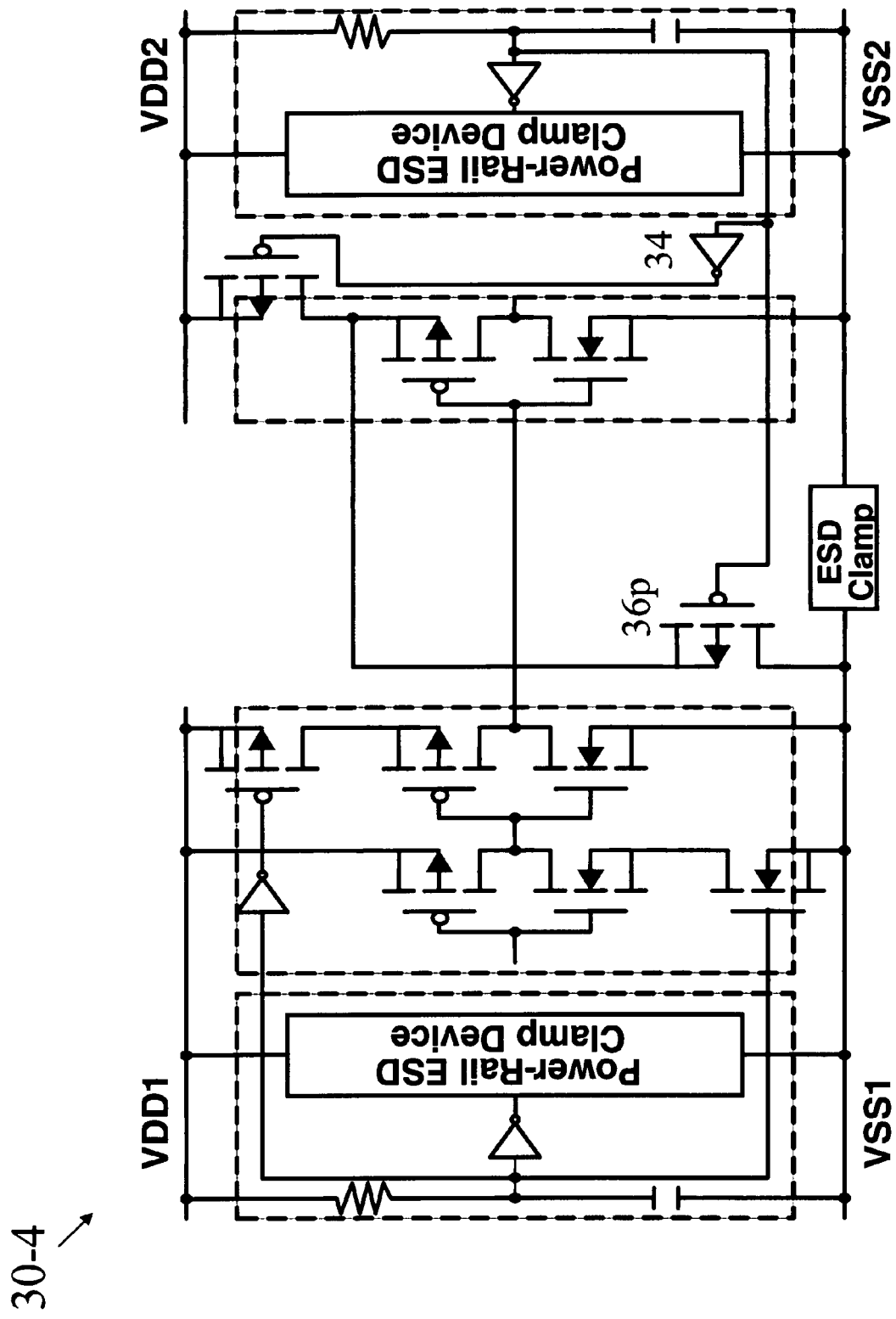
Figure 4A:
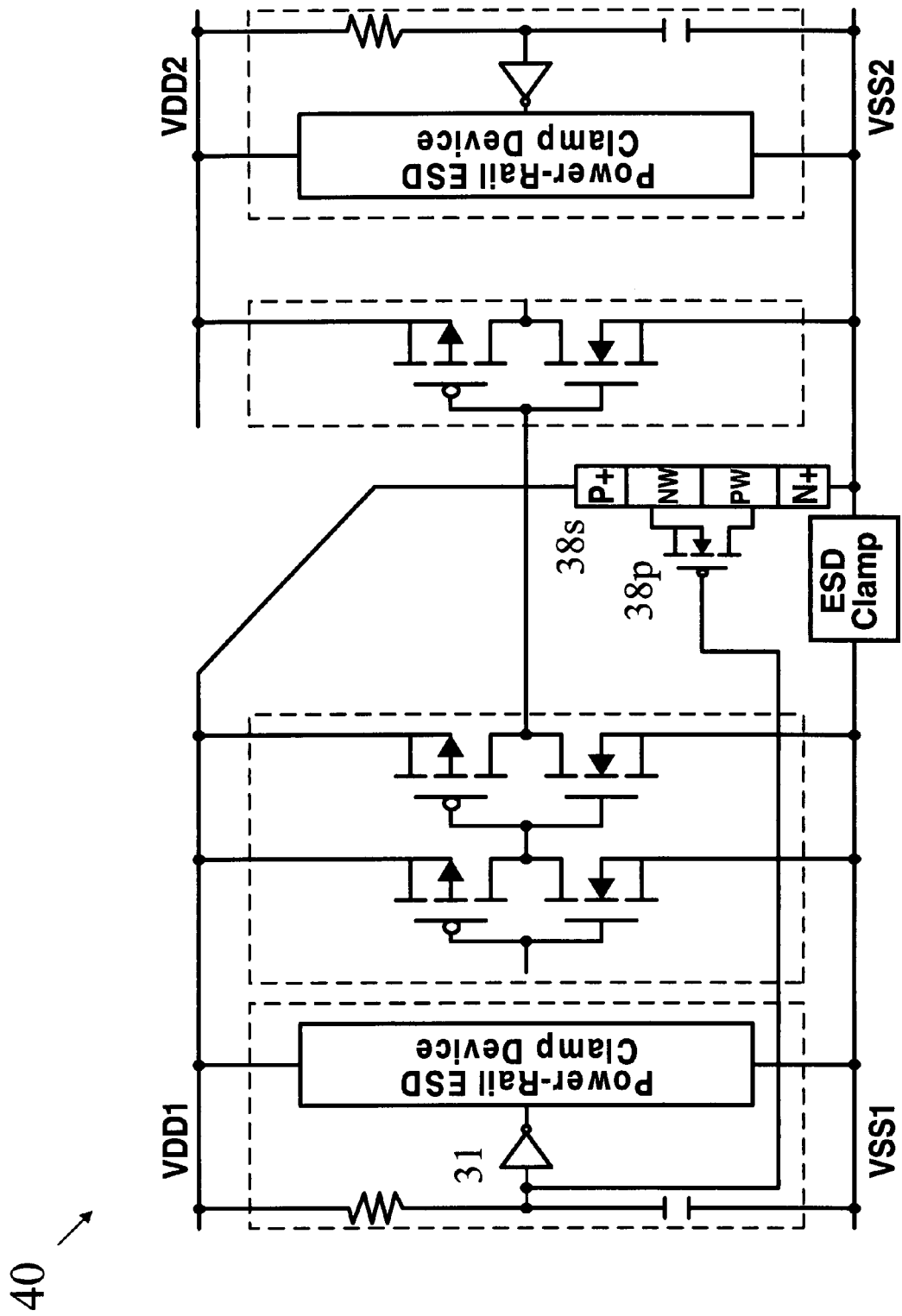
Figure 4B:
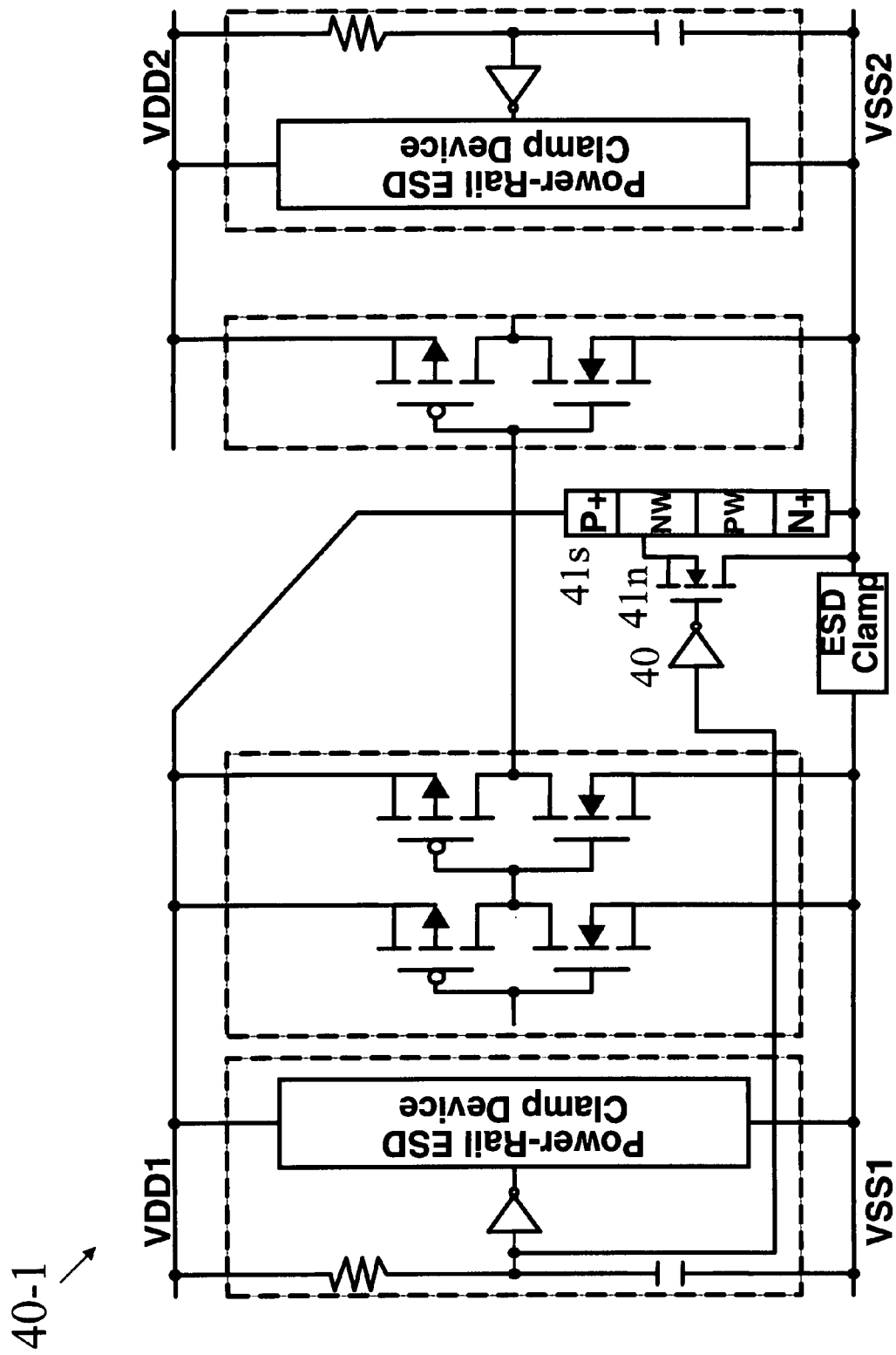
Figure 4C:
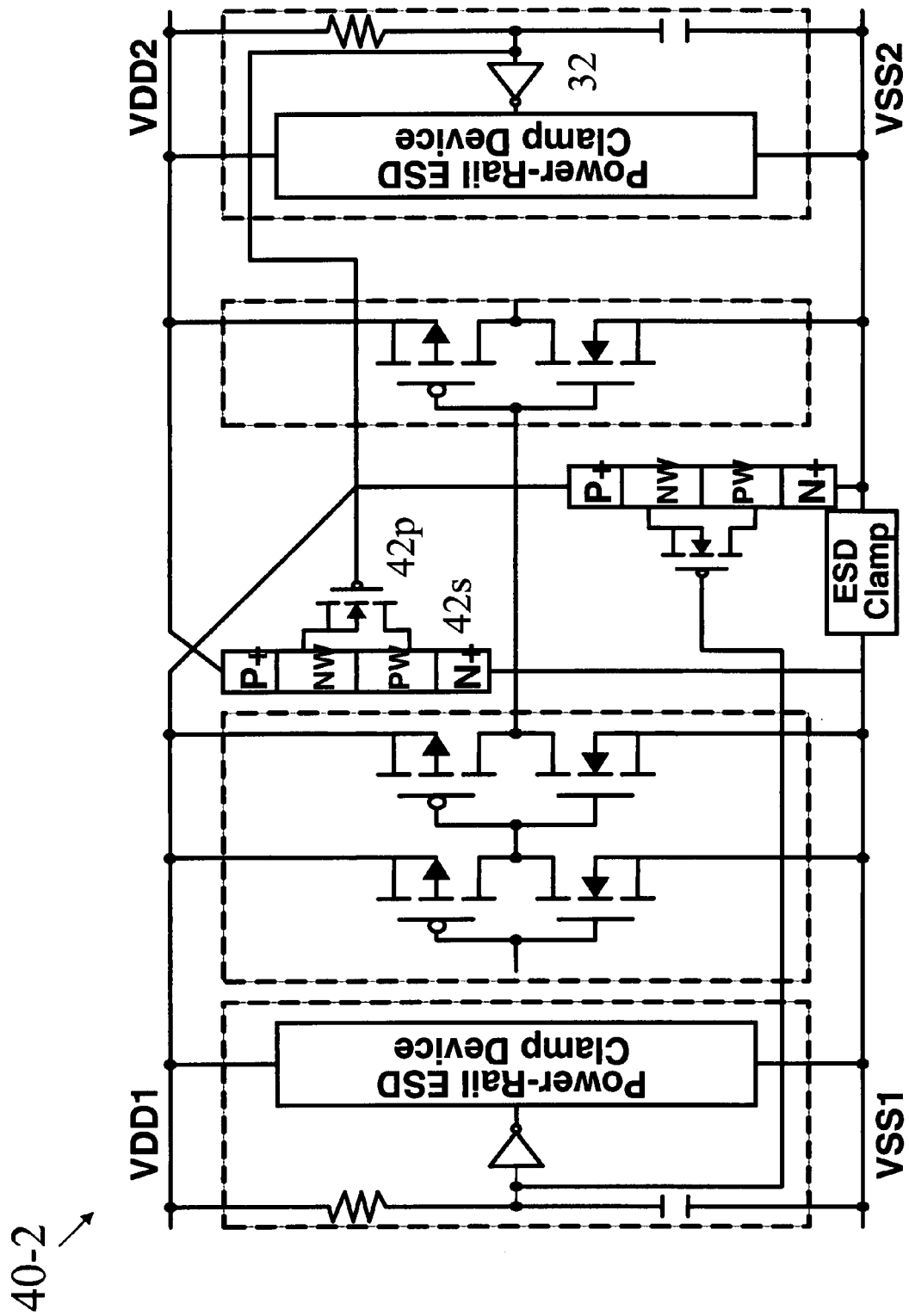

In the drawings:

FIG. 1 is a circuit diagram of a conventional multi-power system;

FIG. 2A is a circuit diagram of an ESD protection circuit consistent with an example of the present invention;

FIG. 2B is a circuit diagram of an ESD protection circuit consistent with another example of the present invention;

FIG. 2C is a circuit diagram of an ESD protection circuit consistent with yet another example of the present invention;

FIG. 2D is a circuit diagram of an ESD protection circuit consistent with still another example of the present invention;

FIG. 2E is a circuit diagram of an ESD protection circuit consistent with yet still another example of the present invention;

FIG. 3A is a circuit diagram of an ESD protection circuit consistent with an example of the present invention;

FIG. 3B is a circuit diagram of an ESD protection circuit consistent with another example of the present invention;

FIG. 3C is a circuit diagram of an ESD protection circuit consistent with yet another example of the present invention;

FIG. 3D is a circuit diagram of an ESD protection circuit consistent with still another example of the present invention;

FIG. 3E is a circuit diagram of an ESD protection circuit consistent with yet still another example of the present invention;

FIG. 4A is a circuit diagram of an ESD protection circuit consistent with an example of the present invention;

FIG. 4B is a circuit diagram of an ESD protection circuit consistent with another example of the present invention; and FIG. 4C is a circuit diagram of an ESD protection circuit consistent with yet another example of the present invention.

DETAILED DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like parts.

FIG. 2A is a circuit diagram of an ESD protection circuit 20 consistent with an example of the present invention. Referring to FIG. 2A, the ESD protection circuit 20 includes a first ESD clamp circuit 21, a second ESD clamp circuit 22, a third ESD clamp circuit 23 and a fourth ESD clamp circuit 24. ESD clamp circuits 21, 22 and 23 provide rail-to-rail ESD protection. The first ESD clamp 21, connected between a VDD1 rail and a VSS1 rail, is capable of protecting a first interface circuit 27 from an ESD stress. The second ESD clamp circuit 22 is connected between the VSS1 rail and a VSS2 rail. The third ESD clamp circuit 23, connected between a VDD2 rail and the VSS2 rail, is capable of protecting a second interface circuit 28 from an ESD stress. The ESD clamp circuit 22 includes, for example, at least one diode. The fourth ESD clamp circuit 24 is capable of protecting a PMOS transistor 28p and an NMOS transistor 28n of the second interface circuit 28 from gate oxide damage due to an ESD current flowing from a PMOS transistor 27p of the first interface circuit 27. Although in the present example each of the first interface circuit 27 and the second interface circuit 28 includes at least one inverter, skilled persons in the art will understand that the interface circuits 27 and 28 may include other devices.

The fourth ESD clamp circuit 24 further includes an NMOS transistor 24n and a PMOS transistor 24p. The NMOS transistor 24n includes a gate and a bulk, both of which (not numbered) are connected to the VSS2 rail, a source (not numbered) connected to a node G between an output of the first interface circuit 27 and an input of the second interface circuit 28, and a drain (not numbered) connected to the VDD2 rail. Skilled persons in the art will understand that the source and drain terminals of a MOS transistor may be exchangeable. Since the gate of the NMOS transistor 24n is connected to the VSS2 rail, the NMOS transistor 24n is turned off during normal operation and therefore does not adversely affect the normal system operation. The PMOS transistor 24p includes a gate (not numbered) connected to the VDD2 rail, a source and a bulk, both of which (not numbered) are connected to the node G, and a drain (not numbered) connected to the VSS2 rail. Since the gate of the PMOS transistor 24p is connected to the VDD2 rail, the PMOS transistor 24p is turned off during normal operation.

If an ESD stress occurs on the VDD1 rail and the VDD2 rail is relatively grounded, an ESD current (not shown) is conducted by the ESD clamp circuits 21, 22 and 23 from the VDD1 rail through the VSS1 and VSS2 rails to the VDD2 rail. Since the ESD current flows through the VSS2 rail, the voltage level of VSS2 is greater than that of the grounded VDD2. Furthermore, since the gate and source of the NMOS transistor 24n are connected to the VSS2 and VDD2 rails, the NMOS transistor 24n is turned on due to a significant gate-to-source voltage. The voltage level at the node G, i.e., Vg, is pulled to the grounded VDD2 level. As a result, the risk of gate oxide damage due to a large stress at the gate of the PMOS transistor 28p is avoided.

If an ESD stress occurs on the VDD1 rail and the VSS2 rail is relatively grounded, an ESD current (not shown) is conducted by the ESD clamp circuits 21 and 22 from the VDD1 rail through the VSS1 rail to the VSS2 rail. Since VDD2 is floating, the PMOS transistor 24p is turned on. The voltage level of Vg is pulled to the grounded VSS2.

FIG. 2B is a circuit diagram of an ESD protection circuit 20-1 consistent with another example of the present invention. Referring to FIG. 2B, the ESD protection circuit 20-1 is similar to the ESD protection circuit 20 illustrated in FIG. 2A except the addition of resistors R1, R2 and R3. The first resistor R1 is connected between the output of the first interface circuit 27 and the input of the interface circuit 28. The second resistor R2 is connected between the source of the PMOS transistor 28p and the VDD2 rail. The third resistor R3 is connected between the source of the NMOS transistor 28n and the VSS2 rail.

Given that the PMOS transistor 24p has a channel resistance R4, the resistors R1, R4 and R3 form a first voltage ladder. Due to voltage division, the voltage at the tap node G, i.e., Vg, is reduced as compared to that without the resistors R1 and R3. As a result, the NMOS transistor 28n is further protected against an ESD stress on the VDD1 rail as the VSS2 rail is relatively grounded. Similarly, given that the NMOS transistor 24n has a channel resistance R5, the resistors R2, R5 and R1 form a second voltage ladder. Due to voltage division, the voltage at a tap node S, i.e., Vs, is reduced as compared to that without the resistors R2 and R1. As a result, the PMOS transistor 28p is further protected against an ESD stress on the VDD1 rail as the VDD2 rail is relatively grounded.

FIG. 2C is a circuit diagram of an ESD protection circuit 20-2 consistent with yet another example of the present invention. Referring to FIG. 2C, the ESD protection circuit 20-2 is similar to the ESD protection circuit 20-1 illustrated in FIG. 2B except a PMOS transistor 25p and an NMOS transistor 25n, which replace the resistors R2 and R3 illustrated in FIG. 2B, respectively. Each of the PMOS transistor 25p and the NMOS transistor 25n is turned on during normal operation of the system, and functions to serve as a resistor in response to an ESD stress.

FIG. 2D is a circuit diagram of an ESD protection circuit 20-3 consistent with still another example of the present invention. Referring to FIG. 2D, the ESD protection circuit 20-3 is similar to the ESD protection circuit 20-1 illustrated in FIG. 2B except a self-biased current trigger ("SBCT") circuit 26. The SBCT circuit 26 includes an NMOS transistor 26n and the second ESD clamp circuit 22. The NMOS transistor 26n includes a gate (not numbered) connected to the VSS1 rail through a resistor (not numbered). During normal operation of the system, the NMOS transistor 26n is turned off. During an ESD stress, the gate of the NMOS transistor 26n is biased due to an ESD current flowing through the second ESD clamp circuit 22. The NMOS transistor 26n is turned on, which pumps the source of the NMOS transistor 28n, reducing the gate to source voltage of the NMOS transistor 28n and in turn lowering the risk of gate oxide damage. The SBCT circuit and the pumping structure have been disclosed in U.S. Provisional Application Ser. No. 60/824,795, entitled "CDM ESD Protection Circuit Using Self-Biased Current Trigger Technique and Pumping Source Mechanism", filed Sep. 7, 2006 by Shih-Hung Chen and Ming-Dou Ker, the same inventors of the present application. The disclosure of the above application is herein incorporated by reference.

FIG. 2E is a circuit diagram of an ESD protection circuit 20-4 consistent with yet still another example of the present invention. Referring to FIG. 2E, the ESD protection circuit 20-4 is similar to the ESD protection circuit 20-3 illustrated in FIG. 2D except the addition of another SBCT circuit 29. The SBCT circuit 29 protects the PMOS transistor 28p from gate oxide damage.

FIG. 3A is a circuit diagram of an ESD protection circuit 30 consistent with an example of the present invention. Referring to FIG. 3A, the ESD protection circuit 30 includes ESD clamp devices 31p, 31n, 32p and 32n, a first inverter 31, a first RC network including a resistor $R_{31}$ and a capacitor $C_{31}$, a second inverter 32, and a second RC network including a resistor $R_{32}$ and a capacitor $C_{32}$. The ESD clamp device 31p includes a gate (not numbered) connected to an output of the first inverter 31, a source and a bulk, both of which (not numbered) are connected to the VDD1 rail, and a drain (not numbered) connected to the source of the PMOS transistor 27p. The ESD clamp device 31n includes a gate (not numbered) connected to an input of the first inverter 31, a source and a bulk, both of which (not numbered) are connected to the VSS1 rail, and a drain (not numbered) connected to the source of an NMOS transistor 37n. The ESD clamp device 32p includes a gate (not numbered) connected to an output of the second inverter 32, a source and a bulk, both of which (not numbered) are connected to the VDD2 rail, and a drain (not numbered) connected to a drain (not numbered) of the ESD clamp device 32n. The ESD clamp device 32n further includes a gate (not numbered) connected to the output of the second inverter 32, and a source and a bulk, both of which (not numbered) are connected to the VSS1 rail.

Each of the first RC network and the second RC network has a delay constant longer than the duration of ESD pulses and shorter than the rising time of a system signal. In one example, the delay constant is in the order of micro seconds relative to ESD pulses in the order of nanoseconds and a system signal in the order of mini seconds.

During normal operation of the system, a node A maintains at a high voltage level due to the shorter delay constant, which turns on the ESD clamp devices 31p and 31n. Similarly, a node D maintains at a high voltage level due to the shorter delay constant, which turns on the ESD clamp device 32p and turns off the ESD clamp device 32n. As a result, the ESD clamp devices 31p, 31n, 32p and 32n do not adversely affect the normal system operation.

During an ESD stress, the node A maintains at a low voltage level due to the longer delay constant, which turns off the ESD clamp devices 31p and 31n. Similarly, the node D maintains at a low voltage level due to the longer delay constant, which turns off the ESD clamp device 32p and turns on the ESD clamp device 32n. If an ESD stress occurs on the VDD1 rail and the VDD2 rail is relatively grounded, given the voltage level on the VDD2 rail being approximately zero, the voltage level on the VDD1 rail, i.e., $V_{VDD1}$, is calculated as follows.

$$V_{VDD1} = V_{hA} + V_{hB} + V_{hC} + I_{ESD}(R_A + R_B + R_C)$$

wherein $V_{hA}$, $V_{hB}$, and $V_{hC}$ are the holding voltages of the ESD clamp circuits 21, 22 and 23, respectively, $I_{ESD}$ is an ESD current conducted through the ESD clamp circuits 21, 22 and 23, and $R_A$, $R_B$ and $R_C$ are the resistances of the ESD clamp circuits 21, 22 and 23, respectively.

Likewise, the voltage levels on the VSS1 and VSS2 rails, i.e., $V_{VSS1}$ and $V_{VSS2}$, are respectively calculated as follows.

$$V_{VSS1} = V_{hB} + V_{hC} + I_{ESD}(R_B + R_C)$$

$$V_{VSS2} = V_{hC} + I_{ESD} R_C$$

Since during the ESD stress the gates (not numbered) of a PMOS transistor 37p and the NMOS transistor 37n are connected to a floating power source, the PMOS transistor 37p is turned on and the NMOS transistor 37n is turned off. Consequently, an NMOS transistor 27n is turned on and the voltage level at a node B, i.e., $V_B$, is pulled to $V_{VSS1}$, which is smaller than $V_{VDD1}$ by $(V_{hA} + I_{ESD} R_A)$. As compared to the circuit 10 illustrated in FIG. 1 wherein the NMOS transistor Mn is exposed to $V_{VDD1}$, the risk of gate oxide damage to the NMOS transistor 28n is alleviated. Similarly, the voltage level at a node C, i.e., $V_C$, is also pulled to $V_{VSS1}$.

Furthermore, if an ESD stress occurs on the VDD2 rail and the VDD1 rail is relatively grounded, given the voltage level on the VDD1 rail being approximately zero, the voltage level on the VDD2 rail, i.e., $V_{VDD2}$, is calculated as follows.

$$V_{VDD2} = V_{hC} + V_{hB} + V_{hA} + I_{ESD}(R_C + R_B + R_A)$$

Likewise, the voltage levels on the VSS2 and VSS1 rails, i.e., $V_{VSS2}$ and $V_{VSS1}$, are respectively calculated as follows.

$$V_{VSS2} = V_{hB} + V_{hA} + I_{ESD}(R_B + R_A)$$

$$V_{VSS1} = V_{hA} + I_{ESD} R_A$$

Since ESD clamp device 32p is turned off and the ESD clamp device 32n is turned on, the voltage level $V_C$ is pulled to $V_{VSS1}$, which is smaller than $V_{VDD2}$ by $(V_{hC} + V_{hB} + I_{ESD}(R_C + R_B))$. As compared to the circuit 10 illustrated in FIG. 1 wherein the PMOS transistor Mp is exposed to $V_{VDD2}$, the risk of gate oxide damage to the PMOS transistor 28p is alleviated. Similarly, the voltage level $V_B$ is also pulled to $V_{VSS1}$.

FIG. 3B is a circuit diagram of an ESD protection circuit 30-1 consistent with another example of the present invention. Referring to FIG. 3B, the ESD protection circuit 30-1 is similar in structure to the ESD protection circuit 30 illustrated in FIG. 3A except inverters 33 and 34. The inverter 33 is connected between the input of the inverter 31 and the gate of the ESD clamp device 31p. The inverter 34 is connected between the input of the inverter 32 and the NMOS 32n. The inverters 33 and 34, disposed closer to the ESD clamp device 31p and the ESD clamp device 32n, respectively, may help enhance the driving efficiency.

FIG. 3C is a circuit diagram of an ESD protection circuit 30-2 consistent with yet another example of the present invention. Referring to FIG. 3C, the ESD protection circuit 30-2 is similar to the ESD protection circuit 30-1 illustrated in FIG. 3B except an ESD clamp device 32n-1, which includes a source (not numbered) connected to the VSS2 rail. If an ESD stress occurs on the VDD1 rail and the VDD2 rail is relatively grounded, the voltage levels at the nodes B and C are respectively pulled to $V_{VSS1}$ and $V_{VSS2}$.

FIG. 3D is a circuit diagram of an ESD protection circuit 30-3 consistent with still another example of the present invention. Referring to FIG. 3D, the ESD protection circuit 30-3 is similar to the ESD protection circuit 30-1 illustrated in FIG. 3B except that the gate (not numbered) of an ESD clamp device 35n is connected to the VSS2 rail through a resistor R. The ESD clamp device 35n, the resistor R and the ESD clamp circuit 22 form an SBCT circuit 35.

FIG. 3E is a circuit diagram of an ESD protection circuit 30-4 consistent with yet still another example of the present invention. Referring to FIG. 3E, the ESD protection circuit 30-4 is similar to the ESD protection circuit 30-1 illustrated in FIG. 3B except that an ESD clamp device 36p replaces the ESD clamp device 32n. The ESD clamp device 36p includes a PMOS transistor 36p further including a gate (not numbered) connected to an input of the inverter 34.

FIG. 4A is a circuit diagram of an ESD protection circuit 40 consistent with an example of the present invention. Referring to FIG. 4A, the ESD protection circuit 40 includes a PMOS-triggered silicon-controlled rectifier ("SCR"), which further includes a PMOS transistor 38p integrated with an SCR 38s. The PMOS transistor 38p includes a gate (not numbered) connected to the input of the inverter 31. The SCR 38s includes an anode (P+ region) connected to the VDD1 rail and a cathode (N+ region) connected to the VSS2 rail. During normal operation, the PMOS transistor 38p is turned off. In response to an ESD stress, the PMOS transistor 38p is turned on to trigger the SCR 38s to conduct an ESD current from the VDD1 rail to the VSS2 rail, or vice versa. The MOS-triggered SCR circuit has been disclosed in, for example, U.S. Pat. No. 6,008,684 to Ker et al., one of the inventors of the present application. The disclosure of the above application is herein incorporated by reference.

FIG. 4B is a circuit diagram of an ESD protection circuit 40-1 consistent with another example of the present invention. Referring to FIG. 4B, the ESD protection circuit 40-1 includes an NMOS-triggered SCR, which further includes an NMOS transistor 41n integrated with an SCR 41s. The NMOS transistor 41n includes a gate (not numbered) connected to an output of an inverter 40. The SCR 41s includes an anode (P+ region) connected to the VDD1 rail and a cathode (N+ region) connected to the VSS2 rail. During normal operation, the NMOS transistor 41n is turned off. In response to an ESD stress, the NMOS transistor 41n is turned on to trigger the SCR 41s to conduct an ESD current from the VDD1 rail to the VSS2 rail, or vice versa.

FIG. 4C is a circuit diagram of an ESD protection circuit 40-2 consistent with yet another example of the present invention. Referring to FIG. 4C, the ESD protection circuit 40-2 is similar to the ESD protection circuit 40 illustrated in FIG. 4A except the addition of another PMOS-triggered SCR, which includes a PMOS transistor 42p integrated with an SCR 42s. The PMOS transistor 42p includes a gate (not numbered) connected to the input of the inverter 32. The SCR 42s includes an anode (P+ region) connected to the VDD2 rail and a cathode (N+ region) connected to the VSS1 rail. During normal operation, the PMOS transistor 42p is turned off. In response to an ESD stress, the PMOS transistor 42p is turned on to trigger the SCR 42s to conduct an ESD current from the VDD2 rail to the VSS1 rail, or vice versa.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. An electrostatic discharge (ESD) protection circuit, the circuit comprising:
    a first set of power rails comprising a first high power rail and a first low power rail;
    a first interface circuit between the first set of power rails, the first interface circuit having at least one gate electrode;
    a first ESD device comprising a terminal coupled to the at least one gate electrode of the first interface circuit; and
    a second ESD device comprising a terminal coupled to the at least one gate electrode of the first interface circuit, the first ESD device and the second ESD device being configured to maintain a voltage level at the at least one gate electrode of the first interface circuit at approximately a ground level when ESD occurs.

2. The ESD protection circuit—OR—The ESD circuit of claim 1, wherein the first ESD device includes a transistor and the transistor includes:
    a first terminal coupled to the at least one gate electrode;
    a second terminal coupled to the first high power rail; and
    a gate coupled to the first low power rail.

3. The ESD protection circuit—OR—The ESD circuit of claim 2, further comprising a resistor coupled between the second terminal of the first ESD device and the first high power rail.

4. The ESD protection circuit—OR—The ESD circuit of claim 2, further comprising a transistor coupled between the second terminal of the first ESD device and the first high power rail.

5. The ESD protection circuit—OR—The ESD circuit of claim 1, wherein the second ESD device includes a transistor and the transistor includes:
    a first terminal coupled to the at least one gate electrode;
    a second terminal coupled to the first low power rail; and
    a gate coupled to the first high power rail.

6. The ESD protection circuit—OR—The ESD circuit of claim 5, further comprising a resistor coupled between the second terminal of the second ESD device and the first low power rail.

7. The ESD protection circuit—OR—The ESD circuit of claim 5, further comprising a transistor coupled between the second terminal of the second ESD device and the first low power rail.

8. The ESD protection circuit—OR—The ESD circuit of claim 1 further comprising:
   a second set of power rails further comprising a second high power rail and a second low power rail; and
   a second interface circuit between the second set of power rails.

9. The ESD protection circuit—OR—The ESD circuit of claim 8, further comprising a resistor coupled between an output of the second interface circuit and the at least one gate electrode of the first interface circuit.

10. The ESD protection circuit—OR—The ESD circuit of claim 8, wherein the second ESD device further comprises a transistor and the transistor includes:
    a first terminal coupled to the at least one gate electrode;
    a second terminal coupled to the first low power rail through a first resistor; and
    a gate coupled to the second low power rail through a second resistor.

11. The ESD protection circuit—OR—The ESD circuit of claim 10, further comprising an ESD clamp circuit coupled between the first low power rail and the second low power rail.

12. The ESD protection circuit—OR—The ESD circuit of claim 8, wherein the first ESD device further comprises a transistor and the transistor includes:
    a first terminal coupled to the at least one gate electrode;
    a second terminal coupled to the first high power rail through a first resistor; and
    a gate coupled to the second high power rail through a second resistor.

13. The ESD protection circuit—OR—The ESD circuit of claim 12, further comprising an ESD clamp circuit coupled between the first high power rail and the second high power rail.

14. A circuit capable of providing electrostatic discharge (ESD) protection, the circuit comprising:
    a first set of power rails comprising a first high power rail and a first low power rail;
    a second set of power rails comprising a second high power rail and a second low power rail;
    a first interface circuit coupled between the first set of power rails, the first interface circuit comprising at least one gate electrode;
    a second interface circuit coupled between the second set of power rails, the second interface circuit further comprising an output coupled to the at least one gate electrode; and
    an ESD device being coupled to the first interface circuit through the at least one gate electrode of the first interface circuit, the ESD device being configured to maintain a voltage level at the at least one gate electrode at approximately a ground level when ESD occurs at the second high power rail as one of the first set of power rails being relatively grounded or when ESD occurs at the first high power rail as one of the second set of power rails being relatively grounded.

15. The circuit of claim 14, further comprising an ESD circuit coupled between the first set of power rails.

16. The circuit of claim 14, further comprising an ESD circuit coupled between the second set of power rails.

17. The circuit of claim 14, further comprising an ESD circuit coupled between the first low power rail and the second low power rail.

18. The circuit of claim 14, further comprising an ESD circuit coupled between the first high power rail and the second high power rail.

19. The circuit of claim 14, wherein the ESD device includes a transistor and the transistor includes:
    a first terminal coupled to the at least one gate electrode;
    a second terminal coupled to the first high power rail; and
    a gate coupled to the first low power rail.

20. The circuit of claim 14, wherein the ESD device includes a transistor and the transistor includes:
    a first terminal coupled to the at least one gate electrode;
    a second terminal coupled to the first low power rail; and
    a gate coupled to the first high power rail.

21. The circuit of claim 17, wherein the ESD device includes a transistor further including a first terminal coupled to the at least one gate electrode, a second terminal coupled to a first end of the ESD clamp circuit through a first resistor, and a gate coupled to a second end of the ESD clamp circuit through a second resistor.

22. The circuit of claim 18, wherein the ESD device includes a transistor further including a first terminal coupled to the at least one gate electrode, a second terminal coupled to a first end of the ESD clamp circuit through a first resistor, and a gate coupled to a second end of the ESD clamp circuit through a second resistor.

23. A circuit capable of providing electrostatic discharge (ESD) protection, comprising:
    a first set of power rails further comprising a first high power rail and a first low power rail;
    a second set of power rails further comprising a second high power rail and a second low power rail;
    a first interface circuit between the first set of power rails further comprising a gate electrode and a first terminal;
    a second interface circuit between the second set of power rails further comprising an output coupled to the gate electrode, the second interface circuit being capable of pulling a voltage level at the gate electrode to that of the second low power rail in response to an ESD stress; and
    an ESD device further comprising a terminal coupled to the first terminal of the first interface circuit, the ESD device being capable of pulling a voltage level at the first terminal to that of the first low power rail or the second low power rail.

24. The circuit of claim 23, further comprising a transistor coupled between the first high power rail and the first terminal of the first interface circuit.

25. The circuit of claim 23, further comprising a transistor coupled between the second high power rail and a terminal of the second interface circuit.

26. The circuit of claim 24, wherein the ESD device includes a gate coupled to a gate of the transistor coupled between the first high power rail and the first terminal of the first interface circuit.

27. The circuit of claim 23, wherein the ESD device includes a terminal coupled to the first low power rail or the second low power rail.

28. The circuit of claim 23, further comprising:
    an inverter further including an input; and
    a transistor further including a gate coupled to the input of the inverter and a terminal coupled to the second low power rail.

29. The circuit of claim 28, further comprising a resistor-capacitor (RC) network between the second set of power rails, the RC network further including a terminal coupled to the input of the inverter.

30. The circuit of claim 23, further comprising a resistor-capacitor (RC) network between the first set of power rails.

31. The circuit of claim 23, wherein the ESD device further comprises:
 a transistor including a gate coupled the first low power rail through a resistor, and a terminal coupled to the second low power rail; and
 an ESD clamp circuit coupled between the first low power rail and the second low power rail.

32. The circuit of claim 30, wherein the ESD device further comprises a gate coupled to a terminal of the RC network, and a terminal coupled to the second low power rail.

33. A circuit capable of providing electrostatic discharge (ESD) protection, comprising:
 a first set of power rails further comprising a first high power rail and a first low power rail;
 a second set of power rails further comprising a second high power rail and a second low power rail;
 a first interface circuit between the first set of power rails further comprising a gate electrode;
 a second interface circuit between the second set of power rails further comprising an output coupled to the gate electrode; and
 an ESD device further comprising a silicon-controlled rectifier (SCR) and a transistor between the second high power rail and the first low power rail, or between the first high power rail and the second low power rail, the ESD device being capable of triggering the SCR in response to an ESD stress occurring on the first high power rail or the second high power rail.

34. The circuit of claim 33, wherein the ESD device is coupled between the second high power rail and the first low power rail.

35. The circuit of claim 33, wherein the ESD device is coupled between the first high power rail and the second low power rail.

* * * * *

UNITED STATES PATENT AND TRADEMARK OFFICE
CERTIFICATE OF CORRECTION

PATENT NO. : 7,692,907 B2
APPLICATION NO. : 11/717948
DATED : April 6, 2010
INVENTOR(S) : Chen et al.

It is certified that error appears in the above-identified patent and that said Letters Patent is hereby corrected as shown below:

Column 8,
Lines 44, 50, 54, 58, and 64, "The ESD protection circuit—OR—The ESD circuit", each occurrence, should read --The ESD protection circuit--.

Column 9,
Lines 1, 5, 11,15, 23, 27, and 35, "The ESD protection circuit—OR—The ESD circuit", each occurrence, should read --The ESD protection circuit--.

Signed and Sealed this

Second Day of November, 2010

David J. Kappos
*Director of the United States Patent and Trademark Office*